United States Patent [19]
Back

[11] Patent Number: 4,533,239
[45] Date of Patent: Aug. 6, 1985

[54] POSITIONING DEVICE FOR AN EXPOSING AND DEVELOPING APPARATUS
[75] Inventor: Günter Back, Diedenbergen, Fed. Rep. of Germany
[73] Assignee: Hoechst Aktiengesellschaft, Frankfurt am Main, Fed. Rep. of Germany
[21] Appl. No.: 499,466
[22] Filed: May 31, 1983
[30] Foreign Application Priority Data
Jun. 3, 1982 [DE] Fed. Rep. of Germany ....... 3220861
[51] Int. Cl.³ .............................................. G03B 27/58
[52] U.S. Cl. ...................................... 355/72; 355/76; 271/236
[58] Field of Search ....................... 355/72, 73, 74, 75, 355/76, 85, 86, 87, 91, 92, 93, 94, 53, 54, 95; 271/236, 245, 250

[56] References Cited
U.S. PATENT DOCUMENTS 2,565,054  8/1951  Watrous ............................. 271/236
4,334,472  6/1982  Back et al. ..................... 101/382 MV
4,462,678  7/1984  Back ................................. 355/3 R Primary Examiner—L. T. Hix
Assistant Examiner—Brian W. Brown
Attorney, Agent, or Firm—Schwartz, Jeffery, Schwaab, Mack, Blumenthal & Evans

[57] ABSTRACT

The positioning device is used in an exposing and developing apparatus for printing forms comprising an exposure table having an exposure position with a forward side, a rear side, and two lateral sides, and a transport device for transporting printing forms onto the exposure table. The positioning device comprises a mechanism for positioning individual printing forms in the transverse direction comprising stop pins mounted on the exposure table on one side of the exposure position, a pressure member mounted opposite the stop members and a pressure mechanism for moving the pressure member laterally of the exposure position toward the stop pins for forcing a printing form laterally against the stop pins. The device also includes a mechanism for longitudinally positioning individual printing forms comprising a stop mounted on the exposure table on the exposure position front side and a slide mounted for movement forward of the exposure position for forcing a printing form toward the forward stop, the transverse positioning mechanism and the longitudinal positioning mechanism are actuated simultaneously.

19 Claims, 4 Drawing Figures

POSITIONING DEVICE FOR AN EXPOSING AND DEVELOPING APPARATUS

BACKGROUND OF THE INVENTION

The present invention relates to a positioning device for an exposing and developing apparatus for processing printing forms which are transported onto an exposure table by transport rollers, and more particularly to a device for positioning the individual printing forms both longitudinally and transversely.

The production of printing forms carrying lettering and images, for example, printing plates which, after exposure and development, are immediately suitable for printing, is carried out by first charging the printing plates electrostatically and then projecting an original, as an image, onto the individual printing plates. Following termination of this exposure process, each printing plate is developed with a developer, fixed and decoated, after which the plate is ready for the printing operation.

German Offenlegungsschrift No. 30 12 761 (equivalent to U.S. Pat. No. 4,334,472) describes a mechanism for feeding and transporting printing plates to an exposure table by means of transport rollers. The uppermost of the printing plates, which are stacked in a plate holder, is gripped by a swiveling lifting cylinder, swung through a semi-circular arc movement, and deposited on a suction plate of the exposure table. The transport rollers in each row are arranged on either side of the suction plate and are driven by a drive roller via drive belts. Those transport rollers which are the first in each row (seen in the direction of printing plate travel) are arranged on swivel blocks which are swiveled outwardly from the rows before the printing plate is put down. This enables the forward part of the printing plate to be deposited on the suction plate without jamming. As soon as the printing plate rests on the suction plate, the first transport rollers are swiveled towards the lateral edges of the printing plate which is then transported forward, its lateral edges being guided in grooves provided in the transport rollers. The printing plate is moved forward on the suction plate until it contacts a stop pin. As soon as the printing plate is positioned by the stop pin, reduced pressure is applied to the suction plate. The printing plate is thus retained in its exposure position. Thereafter, the printing plate is charged by a corona device and subsequently exposed. After exposure, the stop pin is lowered, so that the printing plate can be transported onto a developing table by the transport rollers. In this device, the printing plate is only positioned in the direction of transport, i.e. longitudinally, but not transversely.

German Patent Application No. 31 22 321. 4 (equivalent to U.S. Ser. No. 382,288, U.S. Pat. No. 4,462,678) describes a device for feeding and transporting printing plates onto an exposure table with the aid of rollers which are arranged in pairs and are fastened by means of blocks on two roller-rails. The roller rails are located at both sides of the exposure table, in the direction of transport. The transport rollers which are positioned first, seen in the transport direction of the printing plate, are pivoted outwardly before the printing plate is deposited and, after the printing plate has been deposited, are pivoted in again in order to take over the roller transport, together with the remaining rollers. The printing plate is transported forward on the suction table until it contacts a stop which can be lowered into the suction plate.

When the printing plate has been positioned by the stop, reduced pressure is applied to it so that it is retained in its exposure position. In this device, too, positioning by means of a stop takes place in the direction of transport of the printing plate only, i.e. longitudinally, but not transversely. In the exposure position, the roller rails are swung entirely away from the exposure table, parallel to themselves, thus enabling the outer edges of the printing plate to be exposed without hindrance.

In the known devices, positioning of the printing form is performed in the longitudinal direction only, by bringing the forward edge of the printing form into contact with a stop, without also aligning the back edge of the printing form or, respectively, exerting a contact pressure in the stop direction. No lateral positioning or alignment takes place, apart from the fact that the two longitudinal edges of the printing form are guided in the grooves provided in the transport rollers. For this reason, a precise and reproducible alignment of the printing form on the exposure table is possible to a limited extent only with the known devices.

SUMMARY OF THE INVENTION

An object of the present invention is to provide a device for aligning a printing form exactly on an exposure table.

Another object of the present invention is to provide a positioning device for aligning a printing form both in the longitudinal and in the transverse directions.

A further object of the present invention is to provide a device for aligning a printing form wherein the alignment is produced in a reproducible manner with a high degree of accuracy.

Another object of the present invention is to provide a positioning device which is relatively simple in construction yet highly effective and durable in use.

In accordance with the above and other objects, the present invention is an exposing and developing apparatus for printing forms comprising an exposure table having an exposure position with a forward side, a rear side, and two lateral sides, a transport device for transporting printing forms onto the exposure table, and a positioning device for positioning individual printing forms on the exposure table. The positioning device comprises a mechanism for positioning individual printing forms in the transverse direction comprising stop pins mounted on the exposure table on one side of the exposure position, a pressure member mounted opposite the stop members, a mechanism for moving the pressure member laterally of the exposure position toward the stop pins for forcing a printing form laterally against the stop pins, and a mechanism for longitudinally positioning individual printing forms comprising a stop mounted on the exposure table on the exposure position front side and a slide mounted for movement forward of the exposure position for forcing a printing form toward the forward stop. The transverse positioning mechanism and the longitudinal positioning mechanism are actuated simultaneously.

In accordance with other aspects of the invention, the pressure member comprises a cylindrical hollow pin and a ring surrounding the pin, and is supported on a piston rod of a fluid cylinder.

The slide member is guided in a slotted hole formed in the exposure table and can be pivoted about a pin arranged on the pressure member. A support is provided on the underside of the exposure table in which a fluid cylinder is arranged. The fluid cylinder has a piston rod on which the pressure member is seated.

BRIEF DESCRIPTION OF THE DRAWINGS

The above and other objects will become more readily apparent as the present invention becomes more fully understood in connection with the detailed description to follow in which like reference numerals represent like parts throughout, and in which.

DETAILED DESCRIPTION OF THE PREFERRED EMBODIMENT

Figure 1:
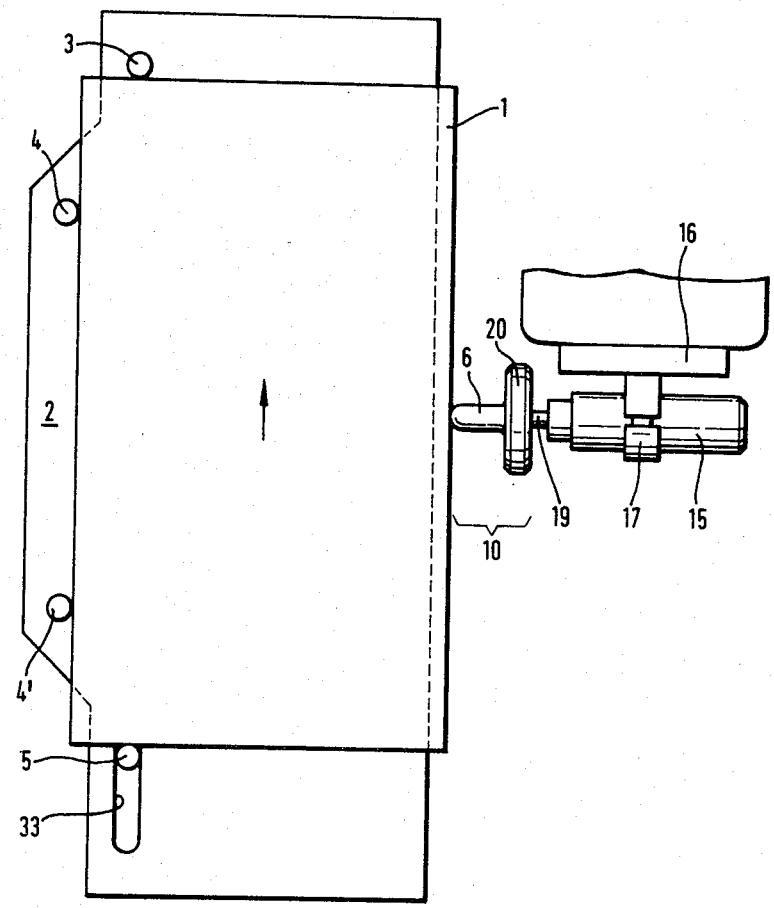
FIG. 1 shows a top view of the positioning device with the mechanisms for the transverse and longitudinal positioning of a printing form.

The device of the present invention includes a mechanism for positioning a printing form in the transverse direction, comprising a pneumatically operated pressure member and stop pins which are adjustably arranged on an exposure table and are located opposite the pressure member. The positioning device also includes a mechanism for positioning the printing form in the longitudinal direction comprising a pneumatically operated slide member and a stop for the front edge of the printing. The positioning operation is begun simultaneously by both mechanisms.

In one embodiment of the invention, the pressure member comprises a cylindrical hollow pin and a ring, and is supported on a piston rod of a lifting cylinder. The position of the cylinder can be adjusted by a holding device fastened to a mounting plate. Advantageously, the pressure member is connected to the piston rod by a pin which is guided in a slot provided in the hollow pin and penetrates the piston rod.

Further, a compression spring is arranged in the interior of the hollow pin, by which the pressure member is pressed against the pin when the piston rod is at rest.

Advantageously, the lifting cylinder is connected with a pressure line through an electromagnetic valve by which compressed air is applied to the lifting cylinder when the electromagnetic valve is excited. The piston rod is moved in the direction of the printing form by the compressed air. The electromagnetic valve is coupled with a throttle-type sound absorber through which the compressed air escapes when the valve is deenergized.

The invention further includes an adjustable setting rail which is fastened to the mounting plate, and on which a microswitch is arranged. A switch lug of the microswitch protrudes into the travel path of the ring of the pressure member. Upon actuation of the microswitch, an electromagnetic valve is excited, through which compressed air is supplied to a vacuum suction head being connected with the exposure table. The suction head creates a vacuum which draws the printing plate onto the exposure table.

The construction of the mechanism for the longitudinal positioning of the printing plate is such that the slide member is guided in a slotted hole provided in the exposure suction table and is mounted in a way that it can be pivoted about a pin on a pressure member. Suitably, a support is fastened to the underside of the exposure suction table in which a lifting cylinder is displaceably arranged. The pressure member rests on the piston rod of the lifting cylinder, and a compression spring is provided in the interior of the pressure member. The piston rod is advantageously equipped with a pin which is guided in a slotted hole provided in the pressure member, and the front surface of the piston rod adjoins the compression spring.

Using this invention, the advantage is achieved that the printing form is pressed against stops with a uniform pressure both in the longitudinal and transverse directions, and that it is perfectly aligned, whereby the pressure is adjusted such that the edges of the printing form are not damaged.

The positioning device shown diagrammatically in FIG. 1 is composed of a mechanism for the longitudinal positioning of a printing form 1, and a mechanism for the transverse positioning of a printing form 1. Printing form 1 may be, for example, a printing plate, which, by means of transport rollers (not shown), is transported onto an exposure table 2.

The mechanism for the transverse positioning of the printing form 1 comprises a pressure member 10 with a pin 6, and stop pins 4,4' which are arranged opposite the pressure member 10 at a distance corresponding to the width of the printing form 1. The exposure table 2 is designed as an exposure suction table to which a vacuum is applied as soon as the positioning of the printing form 1 in the longitudinal and the transverse direction is completed. The pin 6 of the pressure member 10 presses the printing form 1 against the two stop pins 4,4', which are adjustably mounted on the exposure table 2.

The mechanism for the longitudinal positioning of the printing form 1, i.e. for the alignment in the transport direction of the printing plate, is composed of a slide member 5 which can be displaced along a slotted hole 33, and of a stop 3 for the forward edge of the printing plate. Initially, the slide member 5 is pivoted downwardly, so that the printing plate can pass without hindrance. When the whole printing plate has passed the slide member 5, the latter is pivoted up and presses against the rear edge of the printing plate which thus is pushed against the stop 3.

After the plate has been positioned properly, a switch is actuated by the transverse positioning mechanism, and, via an electromagnetic valve, the printing plate is drawn onto the surface of the exposure suction table by a vacuum suction head. This step will now be described in detail with reference to FIG. 3.

The stop 3 for the forward edge of the printing plate is capable of being lowered. As soon as the printing plate has been drawn onto the surface of the exposure suction table 2, the stop 3, the slide member 5 and the pressure member 10 with the pin 6 return to their initial positions. The printing plate is now positioned for exposure.

The detailed description of the mechanism for the transverse positioning of the printing plate will now be set forth with reference to FIG. 2.

The pin 6 of the pressure member 10 pushes the printing plate 1 on the exposure table 2, which has been positioned approximately by means of transport rollers (not shown), against the two stop pins 4,4' located on the opposite side of the exposure table from the pin 6, as shown in FIG. 1. The pressure member 10 comprises the cylindrical hollow pin 6 and a ring 20 and is supported on a piston rod 19 of a lifting cylinder 15. The pressure member 10 is fastened to the piston rod 19 by means of a pin 7 which is guided in a slot 8. In the rest position, the pressure member 10 is pressed against the pin 7 by a compression spring 9 located in the hollow space of the pin 6.

The lifting cylinder 15 can be adjusted by means of a holding device 17 which is fastened on a mounting plate 16. The position of the lifting cylinder 15 in the holding device 17 can be varied by moving the cylinder longitudinally depending on the width of the printing plate to be processed. The lifting cylinder 15 is connected through an electromagnetic valve 13 to a pressure line through which compressed air is applied to the pneumatic lifting cylinder 15 when the electromagnetic valve is actuated. When the compressed air is introduced into the lifting cylinder, the piston rod 19 extends fully. The pressure member 10 travels along with the extending piston rod 19, and the front surface of the pin 6 contacts the longitudinal edge of the printing plate 1. The printing plate 1 is now laterally shifted until it comes into contact with the fixed stop pins 4,4' which are located opposite the pressure member 10. The extension of the piston rod 19 is continued in the hollow space of the pressure member 10 until its full extent has been reached, whereby the compression spring 9 is compressed and the pin 7 is displaced in the slot 8 in the direction of the printing plate. The pressure which is exerted on the printing plate via the pin 6 and by which the printing plate 1 is pressed against the two fixed stops 4,4' exclusively results from the spring 9 of the pressure piece 10. Thus, the piston rod 19, which is fully extended, is damped by the spring, so that the pin 6 contacts the longitudinally extending edge of the printing plate 1 in a resilient manner and not in a rigid manner. This ensures that the edge of the printing plate is not damaged by the fully extended piston rod.

The electromagnetic valve 13 is equipped with a throttle-type sound absorber 14, through which the compressed air 18 can be evacuated without considerable noise when the valve 13 is deenergized, and by means of which the piston movement can be controlled. By deenergizing the electromagnetic valve 36, the suction applied to the exposure suction table is neutralized, so that the printing plate 1 can be removed from the exposure suction table 2.

Figure 2:
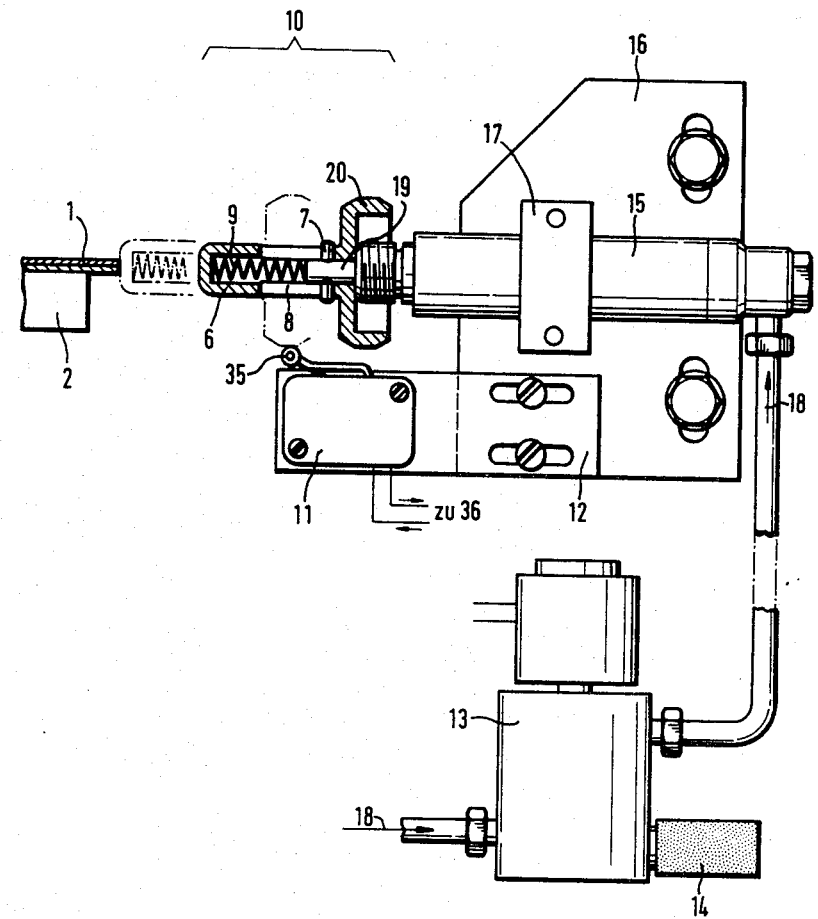
FIG. 2 shows a diagrammatic sectional view of the mechanism for the transverse positioning of the printing form.
Figure 3:
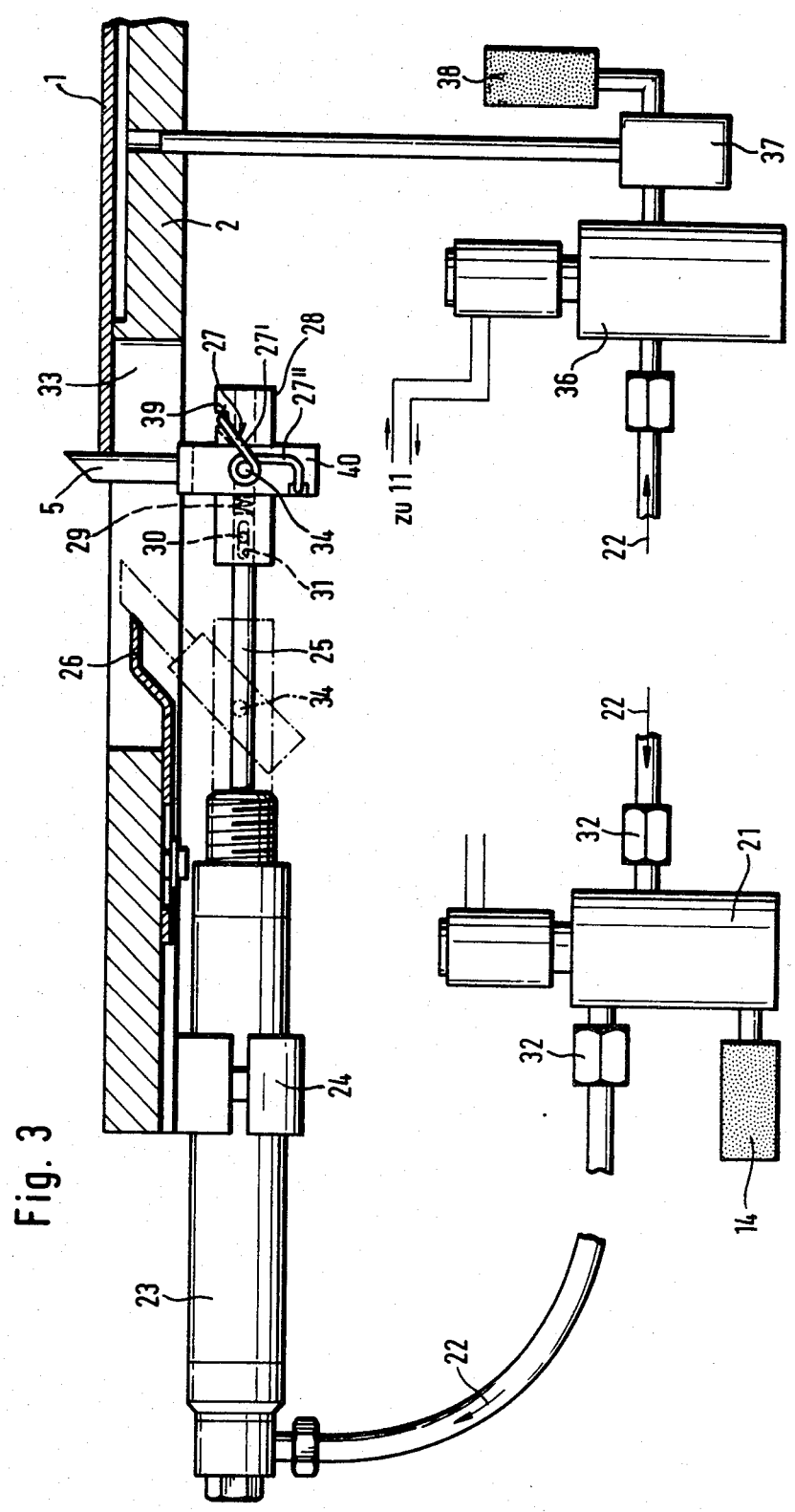
FIG. 3 shows a diagrammatic sectional view of the mechanism for the longitudinal positioning of the printing form.

The longitudinal positioning, which will now be described in detail with reference to FIGS. 2 and 3, is started simultaneously with the positioning in the transverse direction.

An adjustable setting rail 12 is located on the mounting plate 16. A microswitch 11, the switch lug 35 of which protrudes into the path of motion of the ring 20, is installed on the setting rail 12.

When the contact member 10 has moved from the position shown in solid lines in FIG. 2 into the position shown in broken lines, in which the pin 6 is in contact with the longitudinally extending edge of the printing plate 1, the switch lug 35 of the microswitch 11 is depressed by the ring 20. The further electromagnetic valve 36, shown in FIG. 3, is excited by the microswitch 11. Upon excitation of the magnetic valve 36, compressed air is applied to a vacuum suction head 37 which is connected to the exposure suction table 2. In this manner, a reduced pressure or suction is created in the vacuum suction head, by which the printing plate 1 is drawn onto the surface of the exposure suction table 2.

When the printing plate has been drawn onto the suction table 2, the electromagnetic valve 13 is deenergized by a vacuum switch (not shown) while the vacuum is maintained, so that the compressed air 18 is evacuated through the throttle-type sound absorber 14 of the electromagnetic valve 13. In consequence thereof, compressed air is no longer present in the lifting cylinder 15, so that the piston rod 19 and the pressure member 10 can be retracted to their initial position by a return spring (not shown) provided in the lifting cylinder. At this time, the printing plate 1 is held by suction on the exposure suction table in an exactly positioned manner and is ready for exposure.

With reference to FIG. 3, the mechanism for the longitudinal positioning of the printing plate 1 shall now be described in greater detail. The slide member 5 is guided in the slotted guide hole 33 of the exposure suction table 2 and can be pivoted about a pin 34 provided on a pressure member 28.

When being transported onto the exposure table 2, the printing plate 1 passes over the slide member 5 of the mechanism for the longitudinal positioning, which is pivoted down to an inclined position.

A support 24 is provided on the underside of the exposure suction table 2. A lifting cylinder 23, similar to the lifting cylinder 15 for the transverse positioning, is displaceably arranged in this support 24. On the piston rod 25 of the lifting cylinder 23, the pressure member 28 is seated. In its interior, a compression spring 29 is located. Simultaneously with the transverse positioning, an electromagnetic valve 21 is actuated, and the piston rod 25 is forced to the right by means of compressed air 22.

A stop plate 26 protruding into the slotted guide hole 33 of the exposure suction table 2 is installed at the underside of the exposure suction table 2. The stop plate 26 has an angular shape, and when the piston rod 25 of the lifting cylinder 23 is retracted, i.e., is moved to the left in FIG. 3, the slide member 5 is pressed against the stop plate and is pivoted down about the pin 34. The slide member 5 has an inclined front surface which rests about 1 to 2 mm below the surface of the exposure suction table 2 when the slide member 5 is in its downwardly inclined position.

During the movement of the piston rod 25 to the right, the slide member is released from the stop plate 26 and erected by a leg spring 27 located on the pressure member 28, and the front edge of the printing plate 1 is pushed against the stop 3, shown in FIG. 1, by the slide member 5. When the printing plate 1 is in contact with the stop 3, it exerts a slight, uniform pressure onto the slide member 5, which then stops and remains at its respective position. By the piston rod 25, moving forward for a further few millimeters, the compression spring 29 located in the pressure member is compressed.

The piston rod 25 is provided with a pin 30 guided in a slotted hole 31 of the pressure member 28. The front surface of the piston rod 25 is in contact with the compression spring 29, i.e., the movement of the piston rod, which is extended to its final length at full power, is damped by the compression spring 29. The compression spring 29 protects the printing plate 1, positioned between the stop 3 and the slide member 5, from being damaged by the piston rod 25. The application of suction to the printing plate 1, when being thusly positioned, is triggered by the lateral positioning mechanism, as described above with reference to FIG. 2. An air flow control 32 is arranged in the air inlet or, respectively, outlet line of the electromagnetic valve 21. The air flow control 32 controls the speed of the piston rod movement. A throttle-type sound absorber 14 is connected to the electromagnetic valve 21, through which compressed air 22 escapes in a controllable manner when the electromagnetic valve 21 is deenergized. Deenergizing of the electromagnetic valve 21 takes place as soon as the desired vacuum has been achieved in the exposure suction table.

A compression spring (not shown) located in the interior of the lifting cylinder 23 causes the piston rod 25 to be retracted into the lifting cylinder. As mentioned above, the slide member 5 moves to the left in the slotted guide hole 33 until it is forced by the stop plate 26 to assume an inclined position. After exposure of the printing plate 1, another printing plate can be transported over the slide member 5 and be positioned.

The exposure suction table 2 is connected to the electromagnetic valve 36 through the vacuum suction head 37 for the generation of a reduced pressure. When the electromagnetic valve is actuated, compressed air is supplied through it. The vacuum suction head 37 is connected to a sound absorber 38, through which compressed air 22 is discharged whereby the reduced pressure is created in the vacuum suction head during operation, the vacuum head working in accordance with the principle of a Venturi pipe.

Figure 4:
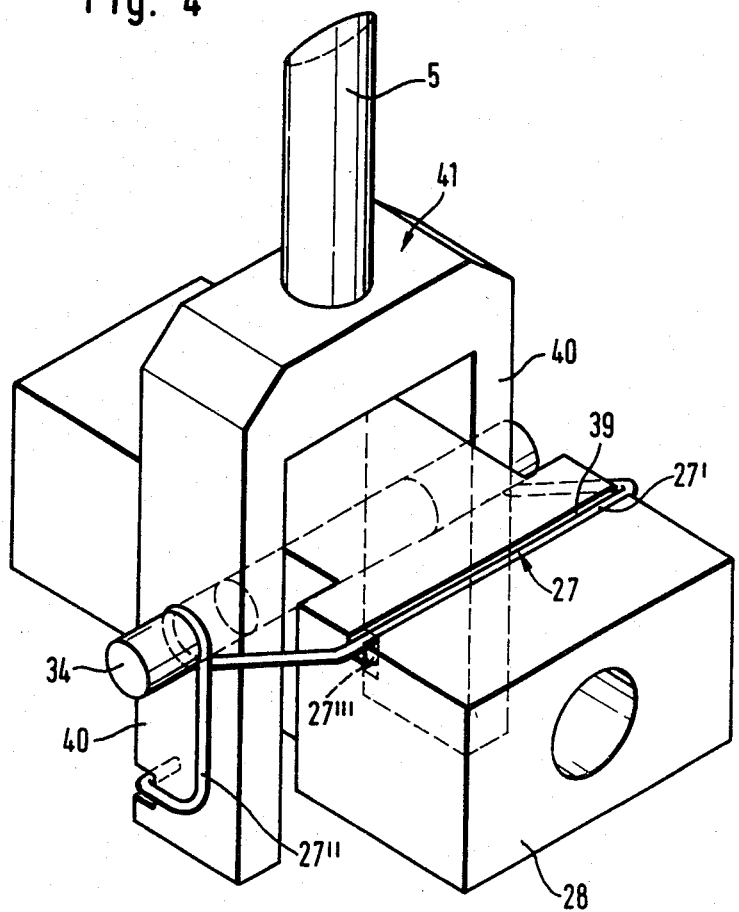
FIG. 4 shows a perspective view of the slide member and the leg spring of FIG. 3.

FIG. 4 shows a perspective view of the contact member 28 and the slide member 5. One leg 27' of the tripartite leg spring 27 engages a groove 39 on the upper side of the pressure member 28. The two other legs 27'' and 27''' of the leg spring 27 embrace legs 40 of a forked member 41, the ends of these two spring legs engaging grooves provided near the edges of the fork legs. In the unloaded state, the leg 27' on the one hand and the legs 27'' and 27''' on the other hand, are divergent. The forked member 41 loosely surrounds the narrower part of the pressure member 28 and is penetrated by the pin 34.

The foregoing description is set forth for the purpose of illustrating the present invention but is not meant to limit its scope in any way. Clearly, numerous modifications, additions or alternative constructions would be apparent within the spirit and scope of the invention as set forth in the appended claims.

What is claimed is:

1. A positioning device for an exposing and developing apparatus for printing forms comprising:
    an exposure table having an exposure position with a forward side, a rear side, and two lateral sides; and
    said positioning device being capable of positioning individual printing forms on said exposure table, and comprising:
        a mechanism for positioning individual printing forms in a transverse direction comprising: stop pins mounted on said exposure table on one side of said exposure position; a pressure member mounted opposite said stop members; and means for moving said pressure member laterally of said exposure position toward said stop pins for forcing a printing form laterally against said stop pins; and
        a mechanism for longitudinally positioning individual printing forms comprising: a stop mounted on said exposure table on said exposure position front side; and a slide mounted for movement forward toward said exposure position for forcing a printing form toward said forward side stop;
    wherein said transverse positioning mechanism and said longitudinal positioning mechanism are adapted to be actuated simultaneously.

2. A positioning device as claimed in claim 1, wherein the pressure member comprises a cylindrical hollow pin and a ring surrounding said pin, and is supported on a piston rod of a fluid cylinder.

3. A positioning device as claimed in claim 2, including a support fastened to a mounting plate, wherein the fluid cylinder is adjustably attached to said support.

4. A positioning device as claimed in claim 2, wherein said hollow pin has a transverse slot and including a fastening pin, said pressure member being fastened to the piston rod, said fastening pin being guided in said slot and penetrating the piston rod.

5. A positioning device as claimed in claim 4, including a compression spring mounted in a interior space of the hollow pin, said spring being positioned to bias said pressure member against said fastening pin when said piston rod is at rest.

6. A positioning device as claimed in claim 3, including a pressure line for receiving compressed air, said pressure line being connected to said fluid cylinder through an electromagnetic valve such that when said electromagnetic valve is actuated, said compressed air enters said fluid cylinder causing an extension of the piston rod in the direction of said exposure position.

7. A positioning device as claimed in claim 6, wherein said electromagnetic valve is connected to a throttle-type sound absorber through which the compressed air is adjustably discharged when the electromagnetic valve is deenergized.

8. A positioning device as claimed in claim 3, wherein said mounting plate carries an adjustable setting rail and a microswitch mounted on said adjustable setting rail said microswitch having a switch lug which protrudes into the path of motion of said ring of the pressure member.

9. A positioning device as claimed in claim 8, including a suction head mounted to said exposure table and wherein the microswitch excites an electromagnetic valve which supplies compressed air to said suction head for producing suction to draw a printing form onto said exposure table.

10. A positioning device as claimed in claim 1, wherein the slide is guided in a slotted guide hole formed in the exposure table and can be pivoted about a pin arranged on a pressure member.

11. A positioning device as claimed in claim 10, wherein on the underside of the exposure table a support is provided in which a fluid cylinder is displaceably arranged, said fluid cylinder having a piston rod on which said pressure member is seated.

12. A positioning device as claimed in claim 11, wherein said piston rod is equipped with a pin guided in a slotted hole of the pressure member, said pressure member having a hollow interior housing a compression spring, the front surface of said piston rod resting against said compression spring.

13. A positioning device as claimed in claim 11, wherein the lifting cylinder is connected to an electromagnetic valve having an air inlet and an outlet, one of which includes an air flow controller for controlling the speed at which the piston rod is moved.

14. A positioning device as claimed in claim 13, wherein a throttle-type sound absorber is connected to said electromagnetic valve, compressed air being controllably discharged from this throttle-type sound absorber when the electromagnetic valve is deenergized.

15. A positioning device as claimed in claim 11, wherein on the underside of the exposure table a stop plate is installed which protrudes into the slotted guide hole of the exposure suction table.

16. A positioning device as claimed in claim 15, wherein the stop plate has an angular shape and the slide member is pivoted obliquely downwardly about the pin by said stop plate when the piston rod is retracted.

17. A positioning device as claimed in claim 16, wherein the slide member has an inclined front surface which rests about 1 to 2 mm below the surface of the exposure suction table when the slide member is pivoted down.

18. A positioning device as claimed in claim 16, wherein a leg spring is arranged on the pressure member and engages the slide member such that the slide member is erected as soon as it is removed from the stop plate.

19. A positioning device as claimed in claim 18, wherein the leg spring comprises three legs, one of its legs engaging a groove on an upperside of the pressure member, and the two other legs embracing legs of a forked member and engaging grooves provided near edges of the legs.

* * * * *